United States Patent
Yang (10) Patent No.: US 8,816,893 B1
(45) Date of Patent: Aug. 26, 2014

(54) ADAPTIVE MULTIPLE CONVERSION RAMP ANALOG-TO-DIGITAL CONVERTER

(71) Applicant: Omnivision Technologies, Inc., Santa Clara, CA (US)

(72) Inventor: Zheng Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/765,574

(22) Filed: Feb. 12, 2013

(51) Int. Cl.
| H03M 1/56 | (2006.01) |
| H04N 5/378 | (2011.01) |
| H03M 1/00 | (2006.01) |
| H04N 5/335 | (2011.01) |

(52) U.S. Cl.
CPC ............. *H03M 1/007* (2013.01); *H03M 1/56* (2013.01); *H04N 5/335* (2013.01)
USPC ........................................................ 341/169

(58) Field of Classification Search
CPC ....... H03M 1/56; H03M 1/202; H03M 1/206; H03M 1/207; H03M 1/0634; H03M 1/0658; H04N 5/23; H04N 5/33; H04N 5/37
USPC ........................................................ 341/169
See application file for complete search history.

(56) References Cited

U.S. PATENT DOCUMENTS

| 5,321,404 | A * | 6/1994 | Mallinson et al. ............. 341/169 |
| 7,554,479 | B2 * | 6/2009 | Lim ............................... 341/169 |
| 2011/0114827 | A1 * | 5/2011 | Yamaoka et al. ......... 250/214 R |
| 2012/0006974 | A1 * | 1/2012 | Egawa ........................ 250/208.1 |
| 2012/0061555 | A1 * | 3/2012 | Ay ............................... 250/208.1 |

OTHER PUBLICATIONS

Snoeij, M. et al., Multiple-Ramp Column-Parallel ADC Architectures for CMOS Image Sensors, IEEE Journal of Solid-State Circuits, vol. 42, Issue: 12, Dec. 2007, pp. 2968-2977.*

Y. Lim et al., "A 1.1e-temporal noise 1/3.2-inch 8 Mpixel CMOS image sensor using pseudo-multiple sampling", in Proc. ISSCC Dig. Tech. Papers, San Francisco, CA, Feb. 2010, pp. 396-397.

Y. Chen et al., "Column-Parallel Digital Correlated Multiple Sampling for Low-Noise CMOS Image Sensors," IEEE Sensors Journal, vol. 12, No. 4, Apr. 2012, pp. 793-799.

Kawahito et al., "Noise Reduction Effects of Column-Parallel Correlated Multiple Sampling and Source-Follower Driving Current Switching for CMOS Image Sensors," 2009 International Image Sensor Workshop.

Suh et al., "Column-Parallel Correlated Multiple Sampling Circuits for CMOS Image Sensors and Their Noise Reduction Effects," Sensors 2010.

\* cited by examiner

*Primary Examiner* — Howard Williams
(74) *Attorney, Agent, or Firm* — Blakely Sokoloff Taylor & Zafman LLP (57) ABSTRACT

An example ramp analog-to-digital converter (ADC) for generating at least one bit of a digital signal includes a modified ramp signal generator, a comparator, and a control circuit. The modified ramp signal generator receives a ramp signal and generates a modified ramp signal in response thereto. The comparator compares an analog input with the modified ramp signal. The control circuit controls the modified ramp signal generator, such that the analog input is converted a variable M number of times for each period of the ramp signal. The number M is dependent on a magnitude of the analog input. In one example, the number M is greater for analog inputs of a lower magnitude, such that the analog inputs of the lower magnitude are converted more times than analog inputs of a higher magnitude.

16 Claims, 7 Drawing Sheets

ADAPTIVE MULTIPLE CONVERSION RAMP ANALOG-TO-DIGITAL CONVERTER

BACKGROUND

1. Field of the Invention

This disclosure relates generally to ramp analog-to-digital converters, and in particular, but not exclusively, those used in the readout circuitry of a complementary metal-oxide-semiconductor (CMOS) image sensor.

2. Background Information

Image sensors are ubiquitous. They are widely used in digital still cameras, digital video cameras, cellular phones, security cameras, medical devices, automobiles, and other applications.

Many image sensors have an image quality that is limited by a number of factors. One example such factor is temporal noise. For example, temporal noise (including various readout noises and quantization noise) can significantly limit the image quality of an image sensor application. Various methods can be implemented to reduce noise. One example for reducing temporal noise is to enlarge the physical device area on the substrate. However, this is typically not feasible given the layout and size constraints in many image sensors.

Another method for reducing temporal noise in an image sensor is with oversampling analog-to-digital converters (ADCs) with noise shaping, such as with sigma-delta ADCs. In yet another method, the average is taken of multiple samples of a pixel output with a fixed number of samples, either with an integrator (e.g., analog multiple sampling), or after the ADC (e.g., digital multiple sampling). However, conventional multiple sampling typically comes with additional circuit cost and the multiple analog-to-digital conversions inherently becomes slower than ADCs that sample just once.

BRIEF DESCRIPTION OF THE DRAWINGS

The invention may be understood by referring to the following description and accompanying drawings that are used to illustrate embodiments. In the drawings.

DETAILED DESCRIPTION

In the following description, numerous specific details are set forth, such as, for example, specific readout circuits, voltage ramp signals, calibration circuits orders of operations, etc. However, it is understood that embodiments may be practiced without these specific details. In other instances, well-known circuits, structures and techniques have not been shown in detail in order not to obscure the understanding of this description.

Figure 1:
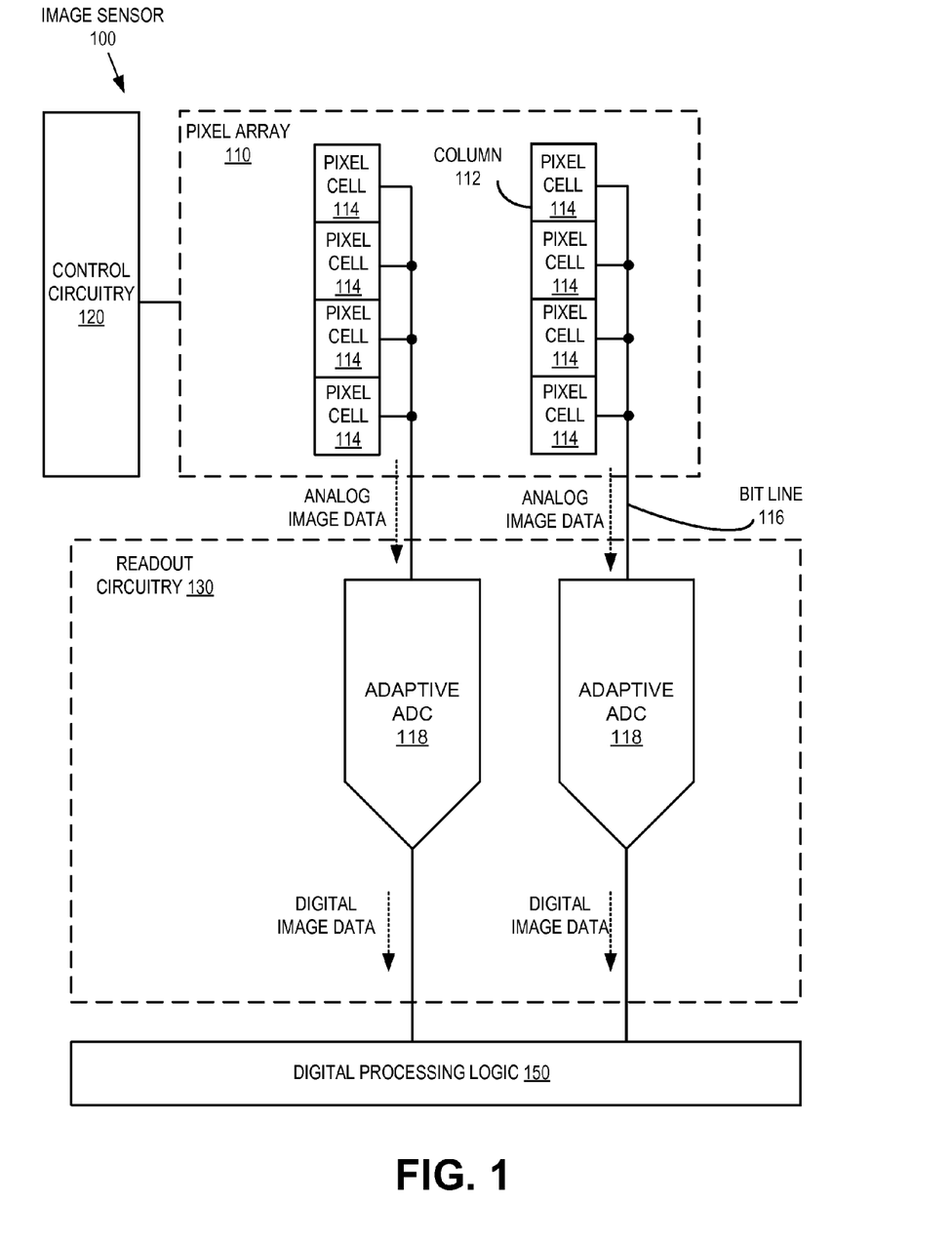
FIG. 1 is a block diagram illustrating an image sensor having multiple adaptive ADCs, in accordance with an embodiment of the present disclosure.

FIG. 1 is a block diagram illustrating image sensor 100 having multiple adaptive ADCs 118, in accordance with an embodiment of the present disclosure. Image sensor 100 includes pixel array 110, control circuitry 120, readout circuitry 130, and optional digital processing logic 150. For simplicity of illustration, the illustrated embodiment of pixel array 110 only shows two columns 112, each having four pixel cells 114. However, it is to be appreciated that actual image sensors commonly include from hundreds to thousands of columns, and each column commonly includes from hundreds to thousands of pixels. Also, the illustrated pixel array 110 is regularly shaped (e.g., each column 112 has the same number of pixels), but in other embodiments the array may have a regular or irregular arrangement different than shown and can include more or less pixels, rows, and columns than shown. Moreover, in different embodiments pixel array 110 may be a color image sensor including red, green, and blue pixels (or other color patterns) designed to capture images in the visible portion of the spectrum, or may be a black-and-white image sensor and/or an image sensor designed to capture images in the invisible portion of the spectrum, such as infra-red or ultraviolet. In one embodiment, image sensor 100 is a complementary metal oxide semiconductor (CMOS) image sensor.

During use, after pixel cell 114 has acquired its image data or charge, the analog image data (e.g., analog signal) or charge may be read out of the pixel cell to readout circuitry 130 via column readout lines or bit lines 116. The analog image data from pixel cells 114 of each column 112 is read out via bit line 116 one pixel at a time to readout circuitry 130 and then transferred to adaptive ADCs 118.

In one embodiment, row by row readout is implemented using correlated double sampling ("CDS"). Prior to reading out image data from a row of pixels in pixel array 110, each pixel in the selected row is reset. Resetting may include charging or discharging a floating diffusion region to a predetermined voltage potential such as VDD.

CDS requires two readouts per pixel to readout circuitry 130: a reset read and an image signal read. Reset read is executed to measure the voltage potential at the floating diffusion region without image charge. Image signal read is executed to measure the voltage potential at the floating diffusion region with image charge, after image charge is transferred to floating diffusion region. Subtracting the reset read measurement from the image signal read measurement produces a reduced noise value indicative of the image charge at floating diffusion region. In one embodiment the CDS is analog CDS where the subtraction of the reset measurement from the image signal read is done in the analog domain prior to analog-to-digital conversion. In another embodiment, the CDS is digital, where each of the reset read measurement and the image signal read measurement are converted via adaptive ADC 118 and stored in memory. Then the subtraction of the two values may be done in the digital domain to arrive at the digital image data.

Adaptive ADCs 118 are multiple conversion ramp ADCs, where each analog image data output from a pixel is converted multiple times. However, as stated above, ADCs 118 are adaptive. Thus, the number of conversions taken for each pixel depends on its signal level. In one embodiment, darker signals are converted more times than lighter signals. Typically, as signal level increases, shot noise gradually becomes the dominant noise component of the signal. Multiple conversions may not reduce shot noise since it is correlated in all conversions. Thus, at large signal levels the benefit of multiple sampling diminishes. Accordingly, embodiments of the present disclosure adapt the number of conversions to the magnitude of the analog image data.

In ramp ADCs, small signals typically finish their conversion faster than large signals. Thus, adaptive ADCs 118 starts a new conversion once the output was determined for a previous conversion during the same period of the ramp signal. If the signal level is less than half of the ramp signal's full swing, more than one conversion will be completed. The smaller the signal, the more times the signal will be converted by adaptive ADC 118. If the last conversion is interrupted by the end of the ramp signal period, then that conversion is discarded. The average of the multiple conversions is then taken and output as digital image data.

Embodiments of ADCs 118 may include a reduced quantization noise that make ADCs 118 perform as if they were conventional ramp ADCs of higher resolution. For example, a 10-bit ramp ADC of the embodiments discussed herein may act as a conventional 12-bit ramp ADC, while only taking one fourth the conversion time. ADCs 118 may even perform better than the conventional 12-bit ramp ADC for low signal levels, since readout noise is also reduced. For high signal levels, however, the SNR may increase only marginally, since shot noise dominates at these levels. In the illustrated embodiment, adaptive ADC 118 is used in an image sensor 100. However, in other embodiments, adaptive ADC 118 may be used in other semiconductor circuits.

Figure 2:
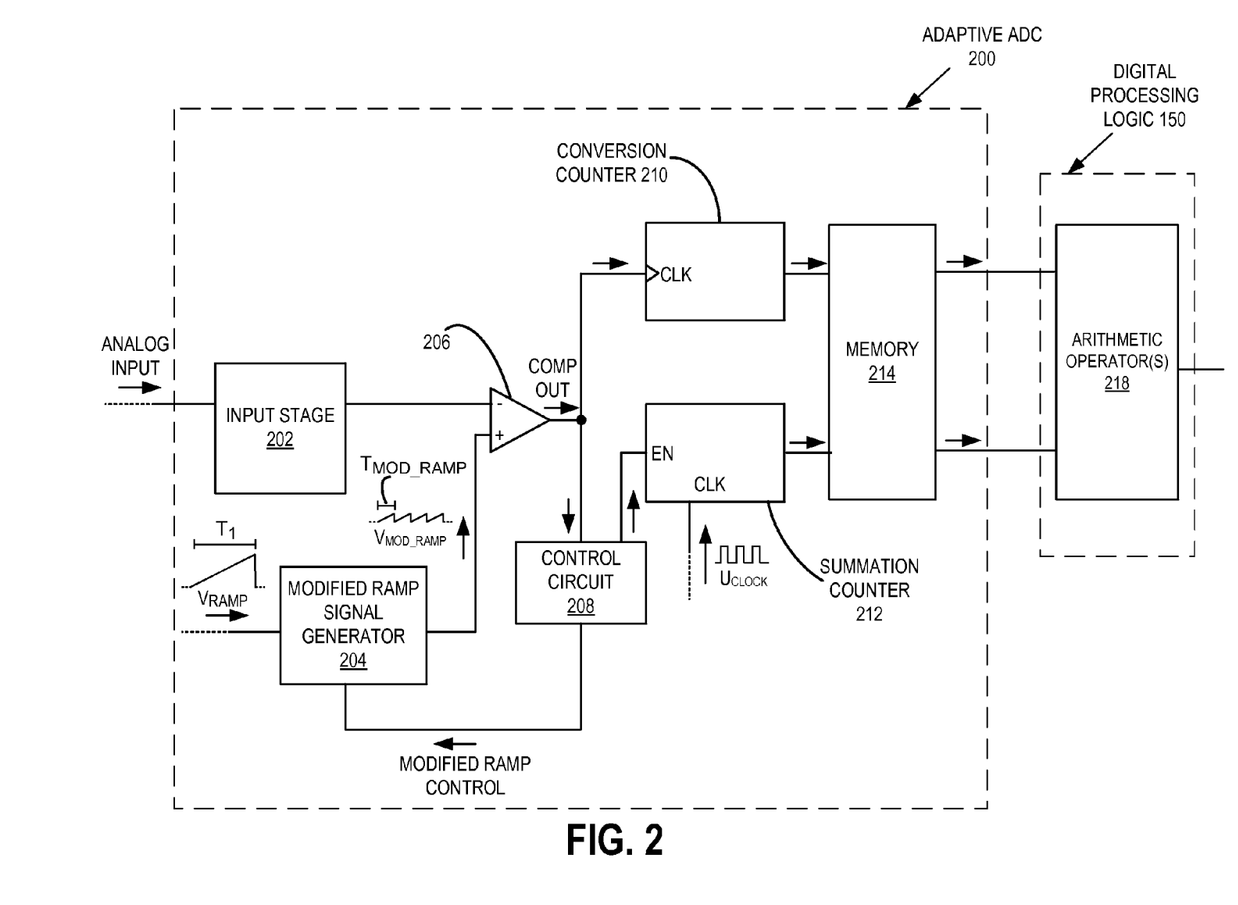
FIG. 2 is a block diagram illustrating an example adaptive ADC, in accordance with an embodiment of the present disclosure.

FIG. 2 is a block diagram illustrating an example adaptive ADC 200, in accordance with an embodiment of the present disclosure. The illustrated example of adaptive ADC 200 is shown as including an input stage 202, a modified ramp signal generator 204, a comparator 206, a control circuit 208, a conversion counter 210, a summation counter 212 and memory 214. ADC 200 is one possible implementation of ADC 118 of FIG. 1.

As shown in FIG. 2, input stage 202 is coupled to receive an analog input, which in one example may be analog image data from a column bit line of a CMOS image sensor. Once received, input stage 202 provides the analog signal to an input of comparator 206. In one embodiment, input stage 202 couples instantaneous changes in the analog signal to the inverting input of the comparator 206.

FIG. 2 further illustrates a modified ramp signal generator 204 that is coupled to receive a ramp signal $V_{RAMP}$ and to generate a modified ramp signal $V_{MOD\_RAMP}$ in response thereto. In one embodiment ramp signal $V_{RAMP}$ is a global ramp signal provided to several adaptive ADCs such as each of the adaptive ADCs 118 of FIG. 1. As can be seen from the embodiment of FIG. 1, modified ramp signal $V_{MOD\_RAMP}$ may have a period $T_{MOD\_RAMP}$ that is shorter than the period $T_1$ of the ramp signal $V_{RAMP}$, such that there are multiple cycles of the modified ramp signal $V_{MOD\_RAMP}$ for each one cycle of the ramp signal $V_{RAMP}$. Each complete cycle (i.e., one period) of the modified ramp signal $V_{MOD\_RAMP}$ may represent one conversion of the analog input. That is, analog input may be converted M number of times where M is the number of complete periods $T_{MOD\_RAMP}$ of the modified ramp signal $V_{MOD\_RAMP}$ for a single period $T_1$ of the ramp signal $V_{RAMP}$. In one embodiment, as will be discussed in more detail below, the number M is dependent on a magnitude of the analog input. For example, M may be greater for analog inputs of a lower magnitude, such that analog inputs of the lower magnitude are converted more times than analog inputs of higher magnitude.

In the illustrated embodiment, comparator 206 is coupled to compare the analog input with the modified ramp signal $V_{MOD\_RAMP}$. In operation, the comparator output COMP OUT will change states in response to a magnitude of the modified ramp signal $V_{MOD\_RAMP}$ reaching the magnitude of the analog input. Control circuit 208 is coupled to control the modified ramp signal generator 204 in response to the comparator output COMP OUT, such that the analog input is converted M number of times. For example, FIG. 2 illustrates control circuit 208 generating a modified ramp control signal in response to the comparator output COMP OUT, where modified ramp signal generator 204 is configured to generate the modified ramp signal $V_{MOD\_RAMP}$ in response thereto. As will be discussed in more detail below, modified ramp signal generator 204 may include a capacitor and switch arrangement to generate the modified ramp signal $V_{MOD\_RAMP}$. For example, control circuit 208 may control the switch to selectively and capacitively couple the ramp signal $V_{RAMP}$ to the comparator where the comparator output COMP OUT indicates when the magnitude of the modified ramp signal $V_{MOD\_RAMP}$ has reached the magnitude of the analog input. The smaller the magnitude of the analog input, the more complete periods $T_{MOD\_RAMP}$ of the modified ramp signal $V_{MOD\_RAMP}$ for each period $T_1$ of the ramp signal $V_{RAMP}$.

Further illustrated in FIG. 2, is a conversion counter 210 and a summation counter 212. Conversion counter 210 is coupled to count the M number of times that the comparator output COMP OUT indicates that the magnitude of the modified ramp signal has reached the magnitude of the analog input for each period $T_1$ of the ramp signal. For example, the comparator output COMP OUT may be coupled to the clock input of the conversion counter 210 such that conversion counter 210 counts each pulse of the comparator output COMP OUT. In one embodiment, not shown in FIG. 2, conversion counter 210 is reset each period $T_1$ of the ramp signal $V_{RAMP}$.

Summation counter 212 is coupled to be enabled during each period $T_{MOD\_RAMP}$ of the modified ramp signal $V_{MOD\_RAMP}$ while the comparator output COMP OUT indicates that the magnitude of the modified ramp signal is less than the magnitude of the analog input. Summation counter 212 is disabled when the comparator output COMP OUT indicates that the magnitude of the modified ramp signal has reached the magnitude of the analog input.

When enabled, the summation counter 212 counts cycles of the clock signal such that the count of the summation counter is representative of the magnitude of the analog input. Summation counter 212 is only reset once for each period $T_1$ of the ramp signal $V_{RAMP}$ such that it keeps a running total of all M number of samples.

Adaptive ADC 200 is further shown as including memory 214. Memory 214 is coupled to conversion counter 210 and summation counter 212. The outputs of memory 214 are coupled to digital processing logic 150. In one embodiment, digital processing logic 150 comprises arithmetic operator 218. Arithmetic operator 218 may perform a divide operation to divide the running total count of summation counter 212 via memory 214 by the number of M conversions counted by conversion counter 210, also via memory 214. Arithmetic operator 218 may then generate the digital output that is representative of the average value of the magnitude of the analog signal over the period $T_1$ of the ramp signal $V_{RAMP}$. In a column-parallel ADC architecture of an image sensor the content of counters from all columns can be transferred to the memory at the same time; then the memory can be read out column-by-column while the ADC's perform the next conversion.

Figure 3:
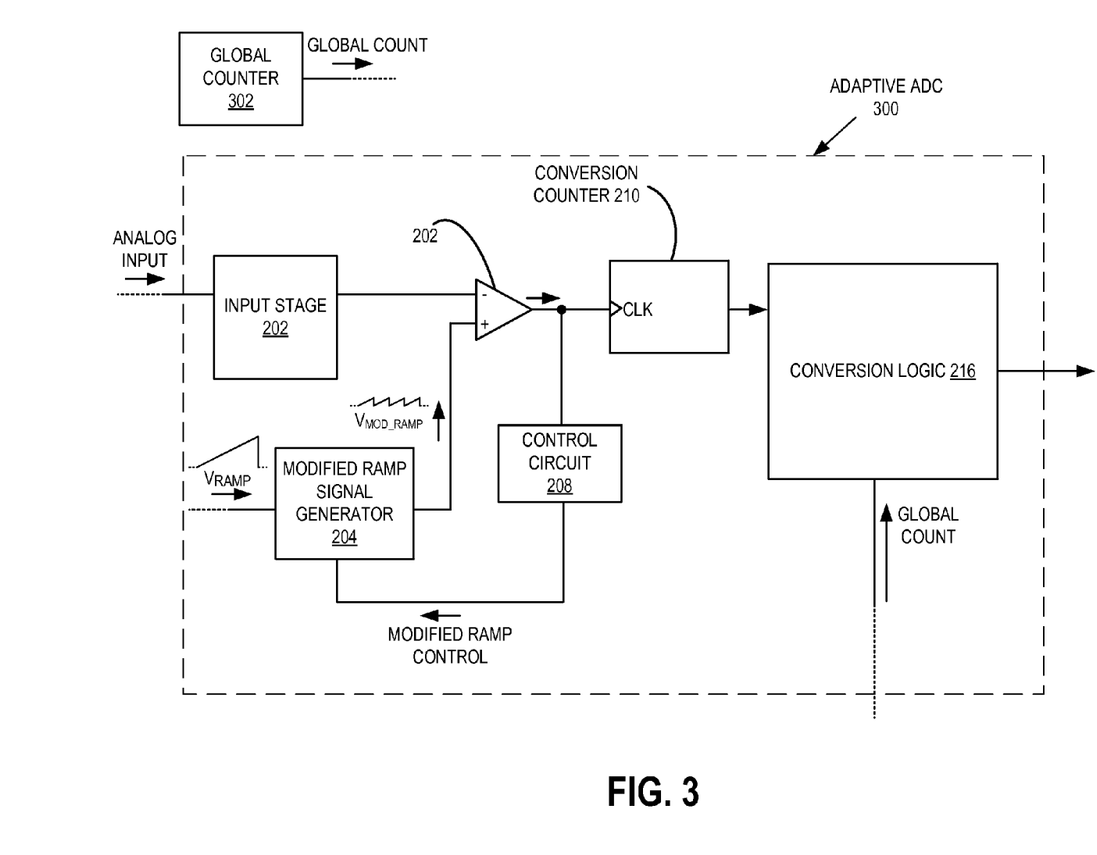
FIG. 3 is a block diagram illustrating an example adaptive ADC utilizing a global counter, in accordance with an embodiment of the present disclosure.

FIG. 3 is a block diagram illustrating an example adaptive ADC 300 utilizing a global counter 302, in accordance with an embodiment of the present disclosure. Adaptive ADC 300 is one possible implementation of adaptive ADC 118 of FIG. 1. Adaptive ADC 300 is similar in configuration and operation to adaptive ADC 200 if FIG. 2. However, adaptive ADC 200 of FIG. 2 included summation counter 212 which is local to adaptive ADC 200. Instead of using a local summation counter 212, adaptive ADC 300 may utilize global counter 302. In one embodiment global count is a global signal provided to several adaptive ADCs such as each of the adaptive ADCs 118 of FIG. 1. Thus, in operation, the count of global counter 302 may be written to conversion logic 216 at the beginning and at the ending of each period $T_{MOD\_RAMP}$ of the modified ramp signal $V_{MOD\_RAMP}$ in order to determine the digital value of that respective conversion. Conversion logic 216 may comprise a memory block and arithmetic operators. The memory block store the digital values of each conversion stored, while the arithmetic operator may summed and divided by the M number of samples taken indicated by the arithmetic operator to generate an average conversion value of the digital output. A bi-directional data path may exist between the memory block and arithmetic operator.

In this embodiment, one arithmetic operator is required for each adaptive ADC 300, while in adaptive ADC 200 of FIG. 2, a plurality of adaptive ADCs may share one arithmetic operator 218.

Figure 4:
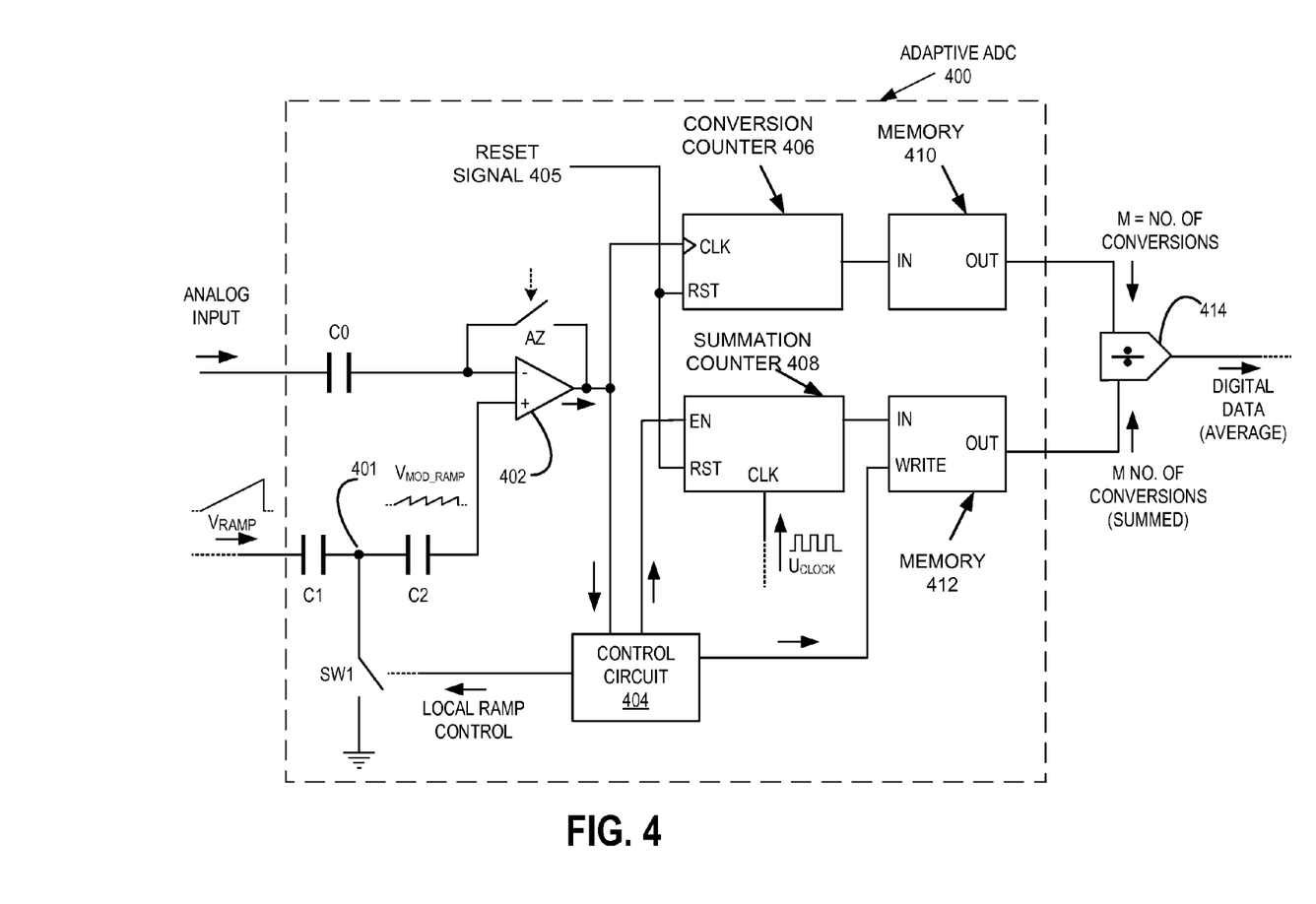
FIG. 4 is a block diagram illustrating an example adaptive ADC, in accordance with an embodiment of the present disclosure.
Figure 5A:
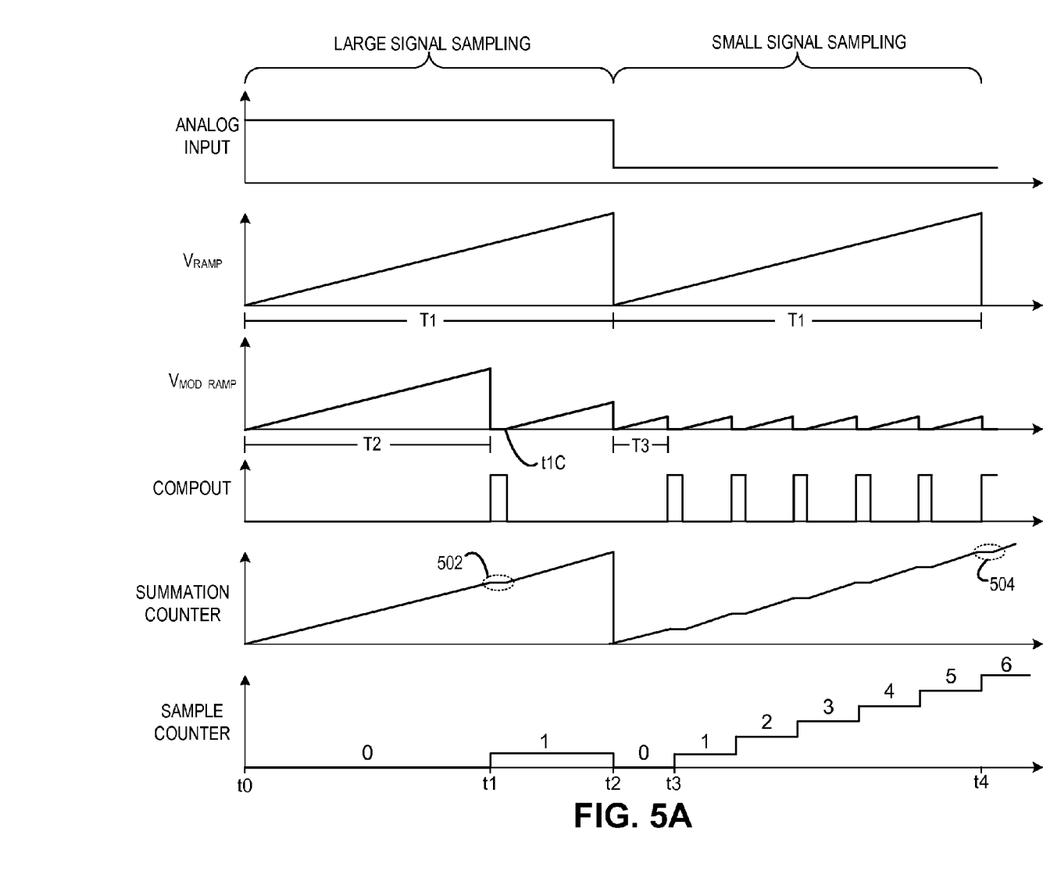
FIGS. 5A and 5B are timing diagrams illustrating various waveforms of the adaptive ADC of FIG. 4.
Figure 5B:
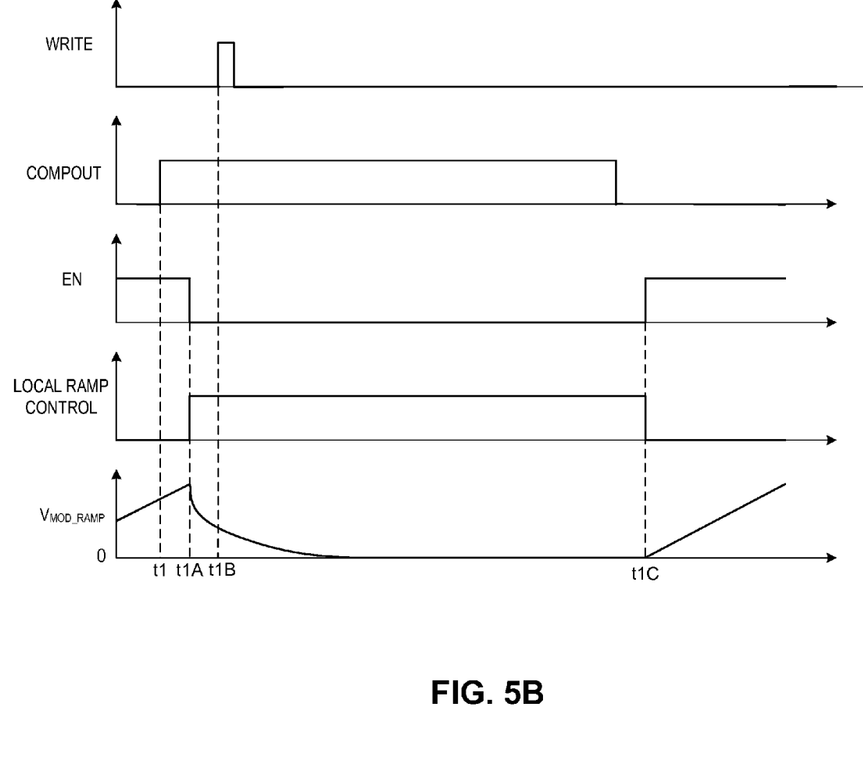
Figure 6:
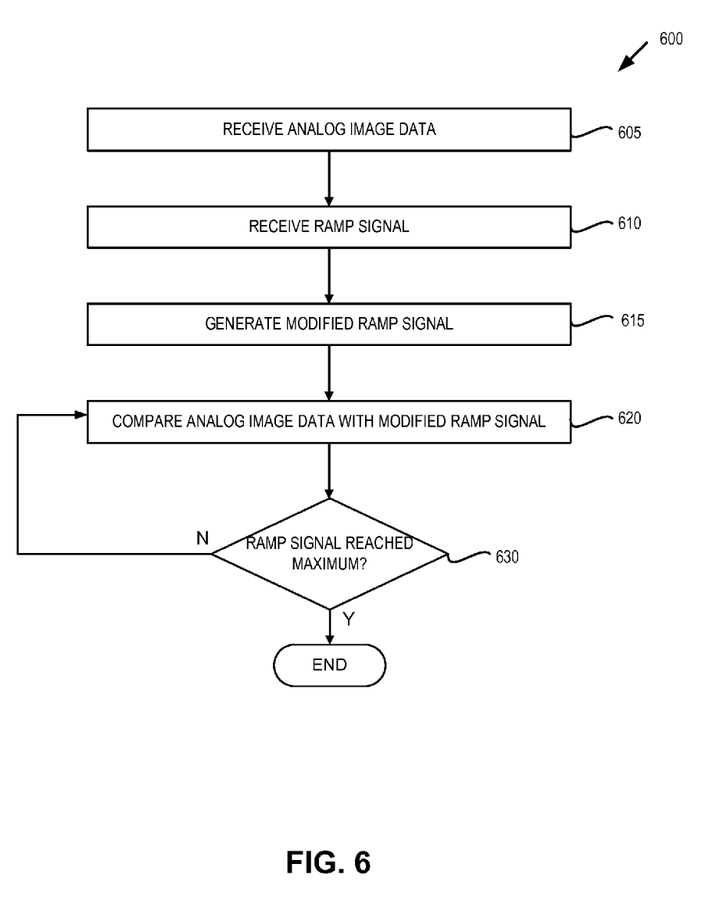
FIG. 6 is a flow diagram illustrating an example analog-to-digital conversion process using an adaptive ADC, in accordance with an embodiment of the present disclosure.

FIG. 4 is a block diagram illustrating an example adaptive ADC 400, in accordance with an embodiment of the present disclosure. Adaptive ADC 400 is one possible implementation of adaptive ADC 200 of FIG. 2. That is, adaptive ADC 400 includes an input stage implemented as a capacitor C0, a comparator 402 with an auto-zero switch AZ, a modified ramp signal generator implemented as capacitors C1, C2 and switch SW1, a control circuit 404, conversion counter 406, summation counter 408, memory 410, and memory 412. FIGS. 5A and 5B are timing diagrams illustrating various waveforms of the adaptive ADC of FIG. 4. FIG. 6 is a flow diagram illustrating an example analog-to-digital conversion process 600 using adaptive ADC 400. The operation of adaptive ADC 400 will now be described with reference to FIGS. 4-6.

First, in process block 605, an analog input is received at capacitor C0, which then provides the analog input to the inverting input of comparator 402. Also, at time t0, in process block 610, ramp signal $V_{RAMP}$ is received at capacitors C1 and C2. With the output of comparator 402 initially low, control circuit 404 opens switch SW1 to couple the ramp signal $V_{RAMP}$ to comparator 402 through capacitors C1 and C2 to generate the modified ramp signal $V_{MOD\_RAMP}$ (i.e., process block 615). With the ramp signal $V_{RAMP}$ coupled to comparator 402 through capacitors C1 and C2, voltage at node 401 (i.e., the modified ramp signal $V_{MOD\_RAMP}$) begins to rise.

Next, in process block 620, comparator 402 compares the analog image data with the generated modified ramp signal $V_{MOD\_RAMP}$. With the output of the comparator 402 initially low (i.e., magnitude of the modified ramp signal $V_{MOD\_RAMP}$ is less than the magnitude of the analog input), the summation counter 408 will be enabled. Thus, at time t0, summation counter 408 will begin counting clock cycles of clock signal $U_{CLOCK}$. Next, at time t1, the magnitude of the modified ramp signal $V_{MOD\_RAMP}$ has reached the magnitude of the analog input. Thus, the output of comparator 402 changes states (e.g., logic HIGH). With the output of comparator 402 high, several events then happen: first, conversion counter 406 is clocked such that its count is incremented by one; second, control circuit 404 sends an enable input to summation counter 408, which is deasserted thereby pausing the count on summation counter 408; third, control circuit 404 closes switch SW1 to decouple the ramp signal $V_{RAMP}$; and fourth, control circuit 404 signals the write input of memory 412 to store the current count 502 of summation counter 408.

In one embodiment control circuit 404 includes a delay circuit (not shown) for generating one or more of the illustrated control signals in response to the comparator output signal COMPOUT. Further with this embodiment, FIG. 5B illustrates an expanded view of a portion of the comparator output signal COMPOUT and the modified ramp signal $V_{MOD\_RAMP}$ as well as additional control signals generated by control circuit 404, when a delay circuit is included. The timing diagram of FIG. 5B is illustrated as beginning at time t1, which corresponds with the comparator output COMPOUT changing to a logic HIGH at time t1 in FIG. 5A. The timing diagram of FIG. 5B further extends until time t1C, which corresponds with the beginning of the next period of the modified ramp signal $V_{MOD\_RAMP}$ at time t1C. As shown in FIG. 5B, at time t1 the output of comparator 402 changes states to a logic HIGH, which starts at least three delays. The first delay is from time t1 to time t1A, and is the delay associated with disabling the summation counter 406 and the closing of switch SW1 in response to the comparator output signal COMPOUT changing states. The second delay is from time t1 to time t1B and is provided to allow the summation counter 406 time to settle before the WRITE command is asserted to write the contents of summation counter 406 to memory 412. The third delay is from time t1 to time t1C and is to prevent the enabling of summation counter 412 and the opening of switch SW1 (via local ramp control signal) before the settling of the comparator output COMPUT.

The decoupling of the ramp signal by way of switch SW1 renders the end of the first complete period T2 of the modified ramp signal $V_{MOD\_RAMP}$. With the ramp signal $V_{RAMP}$ decoupled at time t1A, the output of comparator 402 returns to its low state, after a delay, as shown in FIG. 5B, thereby opening switch SW1 to couple capacitors C1 and C2, and enabling summation counter 408 to resume its count. Process 600 repeats itself at decision block 630 until the ramp signal has reached its maximum (i.e., the end of period T1 is reached). However, at time t2 (i.e., end of ramp signal period T1), the modified ramp signal $V_{MOD\_RAMP}$ has not reached the value of the analog input. Thus, conversion counter 406 is not incremented and the current count on summation counter 408 is disregarded. The count on conversion counter 406 is then stored in memory 410. Arithmetic operator 414 then divides the value 502 stored in memory 412 by the count stored in memory 410 to arrive at the average value of the digital data. At the end of the ramp signal period T1 at time t2, a global reset signal, such as reset signal 405 resets both the conversion counter 406 and the summation counter 408 to ready the adaptive ADC 400 for the next conversion. The embodiment described above from time t0 to time t2 illustrates a large signal sampling where the M number of complete conversions taken is equal to one, such that the average value is the value 502 divided by one.

The embodiment illustrated in FIG. 5A, from time t2 to time t4, illustrates small signal sampling where the analog input is converted multiple times during a single ramp signal period T1. In particular, the small signal analog input is converted six times such that summation counter 408 has a value 504 and the count on conversion counter is six. Thus, at time t4, arithmetic operator 414 calculates an average digital data value as value 504 divided by six. As can be seen from this embodiment small signal levels (i.e., analog input of low magnitudes) are converted more times than large signal levels. In one embodiment the number M of conversions increases as the magnitude of the analog input decreases.

The image sensors disclosed herein may be included in a digital still camera, digital video camera, camera phone, picture phone, video phone, camcorder, webcam, camera in a computer system, security camera, medical imaging device, optical mouse, toy, game, scanner, automotive image sensor, or other types of electronic image and/or video acquisition device. Depending on the implementation, the electronic image and/or video acquisition device may also include other components, such as, for example, a light source to emit light, one or more lenses optically coupled to focus light on the array of pixels, a shutter optically coupled to allow light to pass through the one or more lenses, a processor to process image data, and a memory to store image data, to name just a few examples.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. For example, a calibration circuit may be coupled with a column ADC circuit via an intervening switch.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation and use, of the components of the embodiments. All equivalent relationships to those illustrated in the drawings and described in the specification are encompassed within embodiments. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

One or more embodiments include an article of manufacture (e.g., a computer program product) that includes a machine-accessible and/or machine-readable medium. The medium may include a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, or a combinations thereof. The tangible medium may include one or more solid or tangible physical materials, such as, for example, a semiconductor material, a phase change material, a magnetic material, etc.

Examples of suitable machines include, but are not limited to, digital cameras, digital video cameras, cellular telephones, computer systems, other electronic devices having pixel arrays, and other electronic devices capable of capturing images. Such electronic devices typically include one or more processors coupled with one or more other components, such as one or more storage devices (non-transitory machine-readable storage media). Thus, the storage device of a given electronic device may stores code and/or data for execution on the one or more processors of that electronic device. Alternatively, one or more parts of an embodiment may be implemented using different combinations of software, firmware, and/or hardware.

It should also be appreciated that reference throughout this specification to "one embodiment", "an embodiment", or "one or more embodiments", for example, means that a particular feature may be included in the practice of the invention (e.g., in at least one embodiment). Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment.

What is claimed is:

1. An adaptive analog-to-digital converter (ADC) for generating at least one bit of a digital signal, the adaptive ADC comprising:
   a modified ramp signal generator coupled to receive a ramp signal and to generate a modified ramp signal in response thereto;
   a comparator to be coupled to compare an analog input with the modified ramp signal; and
   a control circuit coupled to control the modified ramp signal generator, such that the analog input is converted a variable M number of times for each period of the ramp signal, wherein the number M is dependent on a magnitude of the analog input, and wherein the modified ramp signal includes M number of complete periods for each period of the ramp signal.

2. The adaptive ADC of claim 1, wherein the number M is greater for analog inputs of a lower magnitude, such that analog inputs of the lower magnitude are converted more times than analog inputs of a higher magnitude.

3. The adaptive ADC of claim 1, wherein the modified ramp signal generator comprises:
a capacitor to capacitively couple the ramp signal to an input of the comparator; and
a switch coupled to control the charging and discharging of the capacitor responsive to the control circuit.

4. The adaptive ADC of claim 3, wherein the control circuit enables the switch to discharge the capacitor in response to an output of the comparator indicating that a magnitude of the modified ramp signal has reached the magnitude of the analog input.

5. The adaptive ADC of claim 4, further comprising a first counter coupled to the comparator to count the M number times that the output of the comparator indicates that the magnitude of the modified ramp signal has reached the magnitude of the analog input for each period of the ramp signal.

6. The adaptive ADC of claim 5, further comprising a second counter coupled to the control circuit to be enabled each period of the modified ramp signal while the output of the comparator indicates that the magnitude of the modified ramp signal is less than the magnitude of the analog input, wherein when enabled, the second counter counts cycles of a clock signal such that a count of the second counter is representative of the magnitude of the analog input.

7. The adaptive ADC of claim 6, further comprising an arithmetic operator coupled to divide the count of the second counter by the count of the first counter to generate the digital output representative of an average value of the magnitude of the analog signal over the period of the ramp signal.

8. An image sensor for generating digital image data, the image sensor comprising:
a pixel array including a plurality of pixel cells arranged into rows and columns for capturing analog image data;
a bit line coupled to at least one of the pixels within a column of the pixel array; and
readout circuitry coupled to the bit line to readout the analog image data from the at least one pixel, the readout circuitry including at least one adaptive analog-to-digital converter (ADC) for generating at least one bit of the digital image data, the adaptive ADC including:
a modified ramp signal generator coupled to receive a ramp signal and to generate a modified ramp signal in response thereto;
a comparator to be coupled to compare an analog input with the modified ramp signal; and
a control circuit coupled to control the modified ramp signal generator, such that the analog input is converted a variable M number of times for each period of the ramp signal, wherein the number M is dependent on a magnitude of the analog input, and wherein the modified ramp signal includes M number of complete periods for each period of the ramp signal.

9. The image sensor of claim 8, wherein the number M is greater for analog image data of a lower magnitude, such that analog image data of the lower magnitude are converted more times than analog image data of a higher magnitude.

10. The image sensor of claim 8, wherein the modified ramp signal generator comprises:
a capacitor to capacitively couple the ramp signal to an input of the comparator; and
a switch coupled to control the charging and discharging of the capacitor responsive to the control circuit.

11. The image sensor of claim 10, wherein the control circuit enables the switch to discharge the capacitor in response to an output of the comparator indicating that a magnitude of the modified ramp signal has reached the magnitude of the analog image data.

12. The image sensor of claim 11, wherein the adaptive ADC further comprises a first counter coupled to the comparator to count the M number times that the output of the comparator indicates that the magnitude of the modified ramp signal has reached the magnitude of the analog image data for each period of the ramp signal.

13. The image sensor of claim 12, wherein the adaptive ADC further comprises a second counter coupled to be enabled each period of the modified ramp signal while the output of the comparator indicates that the magnitude of the modified ramp signal is less than the magnitude of the analog image data, wherein when enabled, the second counter counts cycles of a clock signal such that a count of the second counter is representative of the magnitude of the analog image data.

14. The image sensor of claim 13, further comprising an arithmetic operator coupled to divide the count of the second counter by the count of the first counter to generate the digital image data representative of an average value of the magnitude of the analog image data over the period of the ramp signal.

15. A method of converting analog image data into digital image data with an adaptive analog-to-digital converter (ADC), the method comprising:
receiving a ramp signal and generating a modified ramp signal in response thereto;
receiving analog image data at an input of a comparator of the adaptive ADC, wherein the comparator is coupled to compare the analog image data with the modified ramp signal; and
controlling the modified ramp signal generator such that the analog image data is converted a variable M number of times for each period of the ramp signal, wherein the number M is dependent on a magnitude of the analog image data, wherein generating the modified ramp signal comprises generating the modified ramp signal to include M number of complete periods for each period of the ramp signal.

16. The method of claim 15, wherein the number M is greater for analog image data of a lower magnitude, such that analog image data of the lower magnitude are converted more times than analog image data of a higher magnitude.

* * * * *